United States Patent [19]
Bauer

[11] 3,987,280
[45] Oct. 19, 1976

[54] DIGITAL-TO-BANDPASS CONVERTER

[75] Inventor: Lowell W. Bauer, Liverpool, N.Y.

[73] Assignee: The United States of America as represented by the Secretary of the Navy, Washington, D.C.

[22] Filed: May 21, 1975

[21] Appl. No.: 579,537

[52] U.S. Cl. .......................... 235/150.53; 325/42; 328/167; 340/347 DA
[51] Int. Cl.² .................. G06J 1/00; H03K 13/02
[58] Field of Search ............... 235/150.53, 197, 156, 235/152, 150.5; 325/42, 65, 323; 328/167; 340/347 AD, 347 DA

[56] References Cited
UNITED STATES PATENTS

| | | |
|---|---|---|
| 3,177,349 | 4/1965 | Zaborsky et al. ................. 235/152 |
| 3,521,170 | 7/1970 | Leuthold et al. ................. 325/42 X |
| 3,573,623 | 4/1971 | Bannon et al. ................... 325/42 |
| 3,639,848 | 2/1972 | Elliot ............................... 328/167 |
| 3,789,199 | 1/1974 | Kotwicki ....................... 235/152 X |

Primary Examiner—Joseph F. Ruggiero
Attorney, Agent, or Firm—Richard S. Sciascia; Don D. Doty; Harvey A. David

[57] ABSTRACT

A conversion system is disclosed for generating a desired bandpass waveform from digital samples of a lower frequency, bandlimited original waveform. The system utilizes a single digital to analog converter and an impulse driver to generate a weighted pulse train that contains frequency shifted replicas of the primary spectra of the original waveform. Bandpass filtering rejects all but selected replica spectra for reconstitution.

2 Claims, 12 Drawing Figures

DIGITAL-TO-BANDPASS CONVERTER

STATEMENT OF GOVERNMENT INTEREST

The invention described herein may be manufactured and used by or for the Government of the United States of America for Governmental purposes without the payment of any royalties thereon or therefor.

FIELD OF THE INVENTION

This invention relates to electrical signal conversion or generation of the type wherein analog waveforms are generated from digital samples of a different but related waveform. More particularly, the invention is directed to an improved system for generating selected bandpass analog waveforms related to a lower frequency bandlimited analog signal from digital samples of the latter signal.

DISCUSSION OF THE PRIOR ART

A conventional means of generating such signals has involved the use of a plurality of channels including digital to analog converters, one for in-phase signal components and another for quadrature signal components, lowpass filtering of the digital to analog converter output waveforms, and a balanced modulator to translate the filtered I (in-phase) and Q (quadrature) signals to a suitable carrier frequency. In such an implementation, accurate matching of linearity, gain, and phase characteristics of the I and Q channels is required. Thus, it will be recognized that the described conventional approach to such digital to analog bandpass signal conversion is necessarily more complex and expensive to carry out than is desirable. It will also be appreciated that in highly redundant or duplicative systems using such a technique, size, space, weight, and maintenance factors become increasingly important.

SUMMARY OF THE INVENTION

The present invention aims to overcome most of the shortcomings and disadvantages of prior art systems for conversion of an analog signal to a related bandpass analog waveform by intermediate digital processing through the expedient of using a single digital to analog convert-and-hold means in combination with analog switch means, operated at a selected gating frequency, to produce a train of weighted pulses that are fed to a bandpass filter to produce the desired analog bandpass waveform output.

With the foregoing in mind, it is a principal object of this invention to provide an improved and simplified analog bandpass signal generating conversion system using digital sampling and digital to analog conversion.

Another object of the invention is to effect signal conversion from digital samples taken from a bandlimited analog waveform signal and which utilizes the fact that, if the signal samples are used to weight an impulse train having a frequency equal to or greater than twice the bandwidth of the origional signal, the ideally weighted impulse train will contain the frequency spectrum of the original signal as a primary spectrum and an infinite number of complimentary spectra that are frequency shifted replicas of the primary spectrum.

As another object the invention aims to avoid the need for a plurality of digital to analog converters and for a balanced modulator or mixer to provide a desired carrier frequency by gating the stepped waveform output of a single digital to analog conversion and hold means at a selected pulse train frequency so as to produce a weighted pulse train that is then bandpass filtered to generate the required bandpass waveform signal.

Still another object is the provision of a signal conversion system of the foregoing character which is readily implemented and maintained without inordinate or stringent requirements of matching of linearity, gain, and phase characteristics.

Other objects and many of the attendant advantages will be readily appreciated as the subject invention becomes better understood by reference to the following detailed description, when considered in conjunction with the accompanying drawings.

DESCRIPTION OF THE PREFERRED EMBODIMENT

Figure 1:
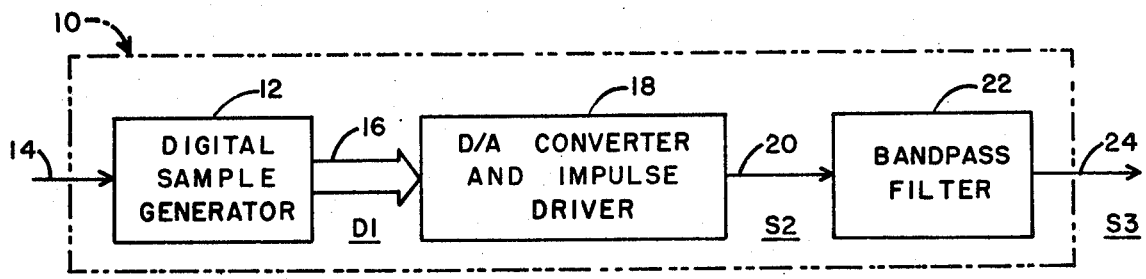
FIG. 1 is a diagrammatic illustration, in block form, of a digital to bandpass conversion system embodying the invention.

In the form of the invention illustrated in FIGS. 1 and 2 of the drawings and described hereinafter, a system 10 comprises a digital sample generator 12 that is adapted to receive a bandlimited signal $s(t)$ as shown by flowline 14. Digital sample generator 12 may be of any well known or conventional construction capable of sampling an analog input signal at a predetermined sampling frequency $f_s$, and to provide, as its output, digital representations of the values of the samples. The digital sample output of generator 12 may conveniently comprise groups of plural bit binary numbers, represented by broad flow line 16, which are fed to a pulse driver 18.

Pulse driver 18, which will be more fully described with reference to FIG. 2, serves to generate, from the digital sample input thereto, a train of weighted pulses that contain, in pulse form, the primary and complementary frequency spectra characteristics of the original signal that was sampled. The weighted pulse train, represented by flow line 20, is fed to a bandpass filter 22 which reconstitutes in analog form only a selected, frequency shifted portion of the complimentary spectra of the original signal as the desired output signal represented by line 24.

Figure 2:
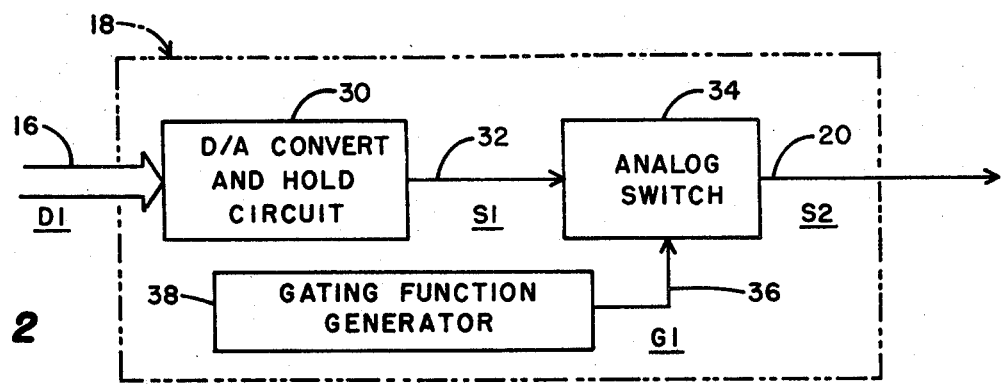
FIG. 2 is a more detailed diagrammatic illustration, in block form, of a portion of the system of FIG. 1.
Figure 3A:
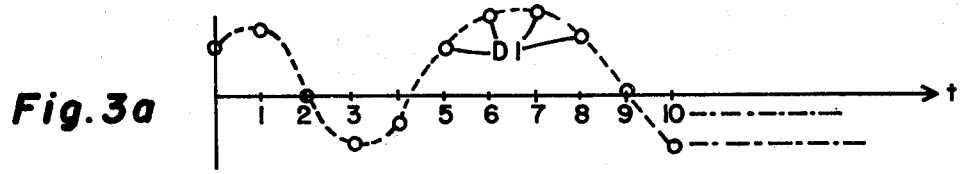
FIGS. 3a–3e are graphic illustrations of characteristic signals within the system.
Figure 3B:
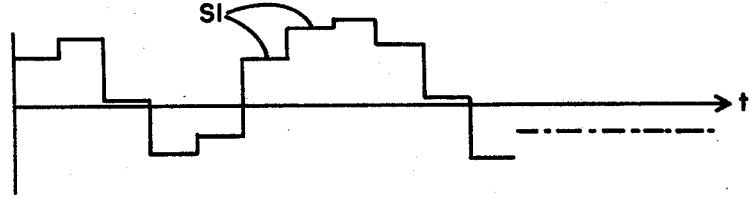
Figure 3C:
Figure 3D:
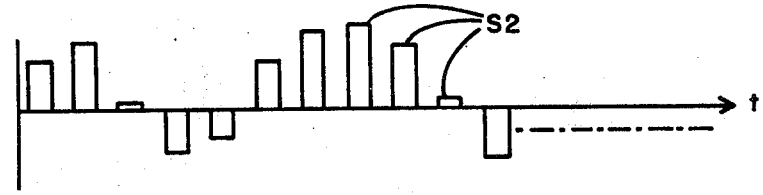

Referring now to FIG. 2, the pulse driver 18 is seen to comprise a digital to analog converter and hold circuit 30 which may be of conventional construction. Circuit 30 receives digital inputs, as shown by line 16, which inputs are digital, e.g., binary, representations D1 of ordinate samples of an initial bandlimited waveform $s(t)$ as shown in FIG. 3a and having a bandwidth W, the samples being taken at a sampling frequency $f_s \geq 2W$. Circuit 30 converts each digital input to an analog voltage level that is held or maintained until the next digital input is received and converted to a subsequent voltage level. The resulting stairstep analog signal output (S1, FIG. 3b) of circuit 30 is applied, as shown by line 32 to an analog switch 34. Switch 34 is responsive to gating signals (G1, FIG. 3c) received as shown by line 36 from a gating function generator 38 to produce the earlier mentioned weighted pulse train which is represented at S2, FIG. 3d. Generator 38 is conveniently a pulse generator operated at the sampling frequency $f_s$. The width of the gating pulses G1 are chosen to represent a compromise between output energy (wide gate pulse) and harmonic content (narrow pulse) of the weighted pulse train output S2 of the driver circuit 18 on line 20 to bandpass filter 22.

MODE OF OPERATION

Figure 4A:
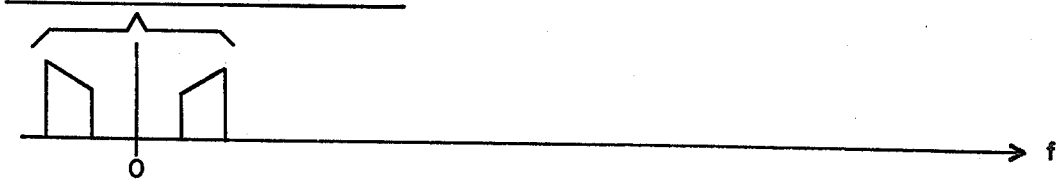
FIGS. 4a–4e are graphic illustrations depicting system spectra.
Figure 4B:
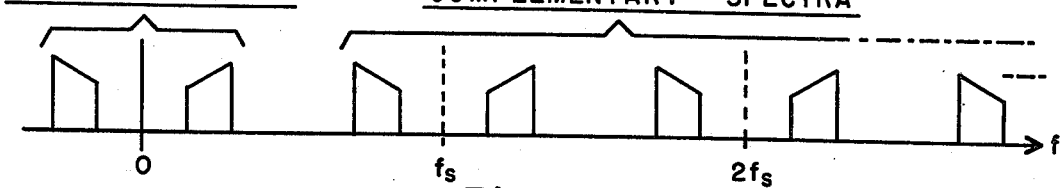

Consider the bandlimited signal $s(t)$ with bandwidth W to be sampled at frequency $f_s$ and digital representations of the samples to be provided by generator 12. FIG. 4a shows an example of low frequency spectrum that is the subject of the sampling. These samples are then used in impulse driver 18 to generate the train S2 of weighted pulses. The weighted pulse train, assuming an ideal impulse driver, then contains the frequency spectrum of the original signal, shown as the primary spectrum in FIG. 4b, and an infinite number of complementary spectra. The complementary spectra are frequency shifted replicas of the primary spectra, centered about integer multiples of the sampling frequency as shown in FIG. 4b. Although an ideal impulse driver and a resulting true weighted impulse train cannot be realized, many simple pulse shapes with sufficient harmonic content can be used to approximate such impulses. The rectangular weighted pulse train output S2 (FIG. 3d) is a good compromise.

Figure 4C:
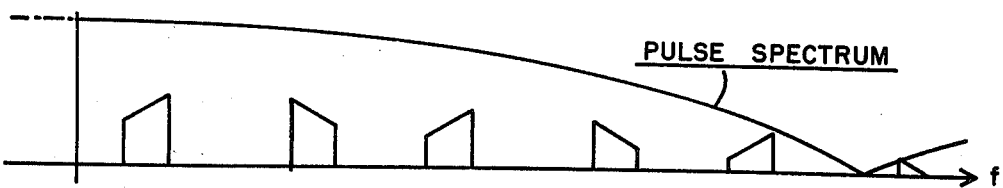

According to theory, it has been shown by those skilled in the art to which the invention pertains, that if a pulse driver generates pulses with a spectrum proportional to P(f), the output spectra of the pulse driver is given by the product of the pulse spectrum and the spectrum of an ideal pulse driver. This relationship is shown in FIG. 4c.

Figure 3E:
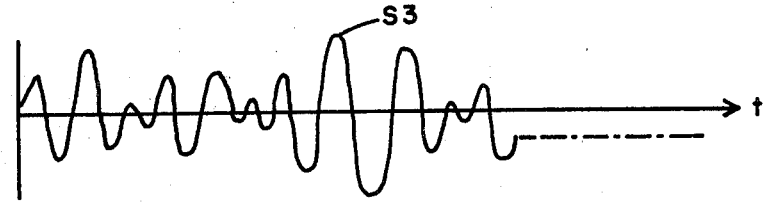
Figure 4D:
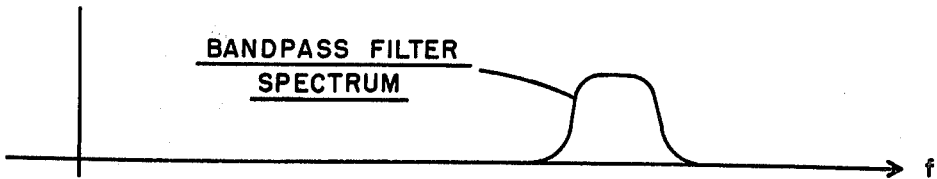
Figure 4E:
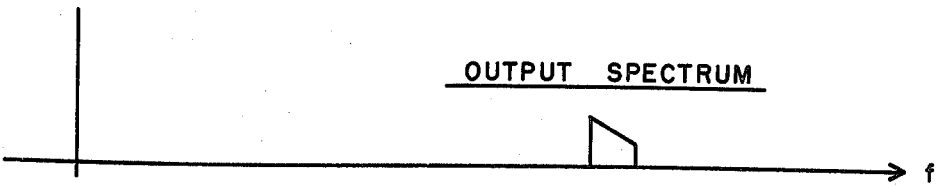

When the output S2, line 20, of pulse driver 18 is bandpass filtered by filter 22 having a bandpass spectrum as shown in FIG. 4d, all but one of the complimentary signal spectra can be rejected leaving only a selected frequency shifted replica (FIG. 4e) of the original low frequency waveform. That selected complementary spectra is that of the desired bandpass waveform S3 of FIG. 3e.

Obviously, other embodiments and modifications of the subject invention will readily come to the mind of one skilled in the art having the benefit of the teachings presented in the foregoing description and the drawing. It is, therefore, to be understood that this invention is not to be limited thereto and that said modifications and embodiments are intended to be included within the scope of the appended claims.

What is claimed is:

1. A signal conversion system for generating a desired bandpass, higher frequency waveform from a relatively lower frequency, bandlimited original waveform, said system comprising:
   a digital sample generator operative to provide a series of digital signals representative of analog samples taken from said original waveform at a predetermined sampling frequency $f_s$ characterized by predetermined intervals;
   a digital to analog convert and hold circuit, responsive to said series of digital signals, to provide a stairstep waveform signal, each level of which is representative of one of said analog samples and persists for one of said intervals;
   a gating function generator operative to provide gating pulses at said predetermined sampling frequency and having a pulse width less than the intervals between samples;
   an analog switch, connected to be responsive to said stairstep waveform signal and to said gating pulses, and operative to provide a train of weighted pulses, said weighted pulses being characterized by having substantially the same widths as said gating pulses, and the same amplitudes as the corresponding levels of said stairstep waveform; and
   a bandpass filter, connected to receive said weighted pulse train, and responsive thereto to provide said higher frequency waveform.

2. A system according to claim 1, and wherein: said bandlimited lower frequency waveform has a frequency bandwidth W and said sampling frequency $f_s$ is equal to or greater than 2W.

* * * * *